United States Patent [19]

Marvin et al.

[11] Patent Number: 4,658,223
[45] Date of Patent: Apr. 14, 1987

[54] HIGH SPEED METHOD OF DETERMINING TEMPERATURE COMPENSATION COMPONENT VALUES

[75] Inventors: Dennis F. Marvin, Roselle; Roger Steele, Chicago, both of Ill.

[73] Assignee: Motorola, Inc., Schaumburg, Ill.

[21] Appl. No.: 688,085

[22] Filed: Dec. 31, 1984

[51] Int. Cl.⁴ .............................................. H03B 5/36
[52] U.S. Cl. ........................................ 331/176; 331/66
[58] Field of Search ................. 331/65, 66, 70, 176; 330/2, 289; 307/310

[56] References Cited

U.S. PATENT DOCUMENTS 3,757,245  9/1973  Berger .................................. 331/66

Primary Examiner—Gene Wan
Attorney, Agent, or Firm—Donald B. Southard; Edward M. Roney; James W. Gillman

[57] ABSTRACT

A method within adjusting values of a passive temperature compensation network for use in an oscillator includes the steps of determining the frequency variation of the oscillator from nominal over a specified temperature range, determining the maximum frequency variation over the temperature range, and recalculating the performance of the circuit over the temperature range utilizing reduced values for the temperature compensation components therein. The oscillation frequency can be utilized as the controlled parameter to a laser based component trimming system. Power is applied to the oscillator and the compensation component is trimmed until the circuit oscillates at the specified target frequency.

21 Claims, 3 Drawing Figures

HIGH SPEED METHOD OF DETERMINING TEMPERATURE COMPENSATION COMPONENT VALUES

FIELD OF THE INVENTION

The invention pertains to methods of determining values of temperature compensation components to minimize variations from a nominal output frequency of a crystal oscillator.

BACKGROUND

It has been known for a long time that the output frequency of a crystal oscillator will vary from its expected, nominal, frequency as the temperature of the oscillator varies. The temperature ranges of such oscillators might be from minus thirty degrees centigrade to plus seventy degrees. Uncompensated frequency variations might be as much as 5–20 parts per million over the above temperature range.

In the prior art, with respect to AT cut crystals, passive compensation networks have been used. These networks include capacitance added in series with the crystal to reduce the variation in output frequency. While added series capacitance is effective in reducing the frequency variation, the problem of determining the correct value or values to add has been and continues to be without a satisfactory solution.

Values of temperature compensation components have often been arrived at by a trial and error iterative process. A "best guess" is made at the compensation values. The circuit is built and then tested over the temperature range. This testing requires both the use of cooling and heating equipment as well as the use of measuring equipment to determine the output frequency of the oscillator at various temperatures.

Once the actual frequency variation has been determined, the compensation elements can be changed, if necessary, to bring it into specification. The test must the be rerun.

The above iterative process can take a relatively long time and can require six or seven iterations. The process of changing components, including soldering and unsoldering can have a deleterious effect on the long term reliability of the circuit. In addition, the circuit must be physically arranged to enable this component replacement to take place. This of course imposes limitations on the physical size of the circuit.

As an alternate, an integrated circuit has been developed to compensate AT cut crystal oscillators. This circuit is disclosed in U.S. Pat. No. 4,254,382 assigned to the assignee of the present invention. The integrated circuit provides a temperature varying voltage which is applied to a varactor diode. The integrated circuit will provide very precise compensation over a wide range of operating temperatures.

As is illustrated in FIG. 1 of the abovenoted patent, for temperature ranges between minus ten degrees centigrade and plus fifty degrees centigrade the variation in frequency with temperature is essentially a linear function with a negative slope. Many electronic circuits have operating ranges that correspond to this temperature range. For such circuits, passive compensation networks are often preferred because of cost, space or power considerations. There thus continues to be a need for a better method to determine values of compensation capacitors in passive compensation networks.

It is therefore an object of the present invention to provide a method of adjusting the values of passive temperature compensation components which does not require removing and replacing such components from the circuit.

It is a further object of the present invention to provide a method of adjusting the values of passive temperature compensation components which determines in an interactive fashion acceptable component values based on a circuit model rather than by a trial and error process.

It is a further object of the present invention to determine oscillation frequency values to which a temperature compensation capacitor and a trim capacitor can be adjusted by using a laser beam and without removing either capacitor from the oscillator circuit.

SUMMARY OF THE INVENTION

In accordance with the invention a method of adjusting the value of a temperature compensation component in a circuit is provided. The method includes the steps of:
  (a) correlating the model performance of the circuit with the measured performance thereof while utilizing initial values for said designated components therein for establishing a first previous performance having a maximum variation with respect to the desired nominal frequency;
  (b) fractionally modifying the values of said designated components to predict a new performance having a new maximum variation with respect to the desired nominal frequency without adjusting and measuring said circuit;
  (c) comparing the new performance with a previous performance and, if there is an improvement, updating the previous performance before repeating step (b) above; and
  (d) utilizing the present values of the designated components to calculate a first and second target output frequency corresponding thereto for adjusting each designated component in a predetermined order while remaining at a fixed temperature, thereby simplifying the adjustment process for optimizing the output frequency versus temperature performance of the circuit.

In a preferred embodiment of the method wherein the circuit is a crystal controlled oscillator and the temperature compensation component is a capacitor.

A frequency trim capacitor is included in this oscillator circuit to offset the effects of adjusting the temperature compensation capacitor, and the method of the present invention is able to trim this frequency trim capacitor such that the loop reactance of the frequency determining components maintains an essentially constant value during the reiterative adjustment process. In the preferred embodiment of the present invention the frequency trim component is also a capacitor.

In a further embodiment of the invention, the temperature compensation component can be a capacitor and the determined electrical parameter can be an output frequency of a crystal controlled oscillator. In a further embodiment of the invention, the method can also include the step of reducing the value of the temperature compensation component, while the oscillator has power applied thereto, and simultaneously measuring the actual value of the output frequency. When the value of the actual output frequency equals the value of the corresponding electrical parameter, the method is complete. The oscillator will have a value of temperature compensation capacitor which will result in an acceptable, minimal frequency variation from the nominal frequency over the specified temperature range. In a further embodiment of the invention, a laser based capacitor trimming apparatus can be used to adjust the value of the temperature compensation capacitor.

An advantage of the present method is that the output parameters provided to the component adjusting apparatus can be readily measurable electrical parameters of the circuit as opposed to component values. These electrical parameters can be chosen to be measurable while the circuit has power applied thereto and is functioning as designed at a specified ambient temperature.

A further advantage of the present method is its speed. Iterations to determine the output electrical parameter or parameters can be performed off-line based on previously supplied input data. The physical circuit need be handled only once during the entire compensation component adjustment process. This is when the circuit is placed in the component adjusting apparatus. Since there are no component substitutions necessary with the present method, after one pass through the component adjusting apparatus, the circuit can be ready for final testing without further handling.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

DESCRIPTION OF THE PREFERRED EMBODIMENTS

Figure 1:
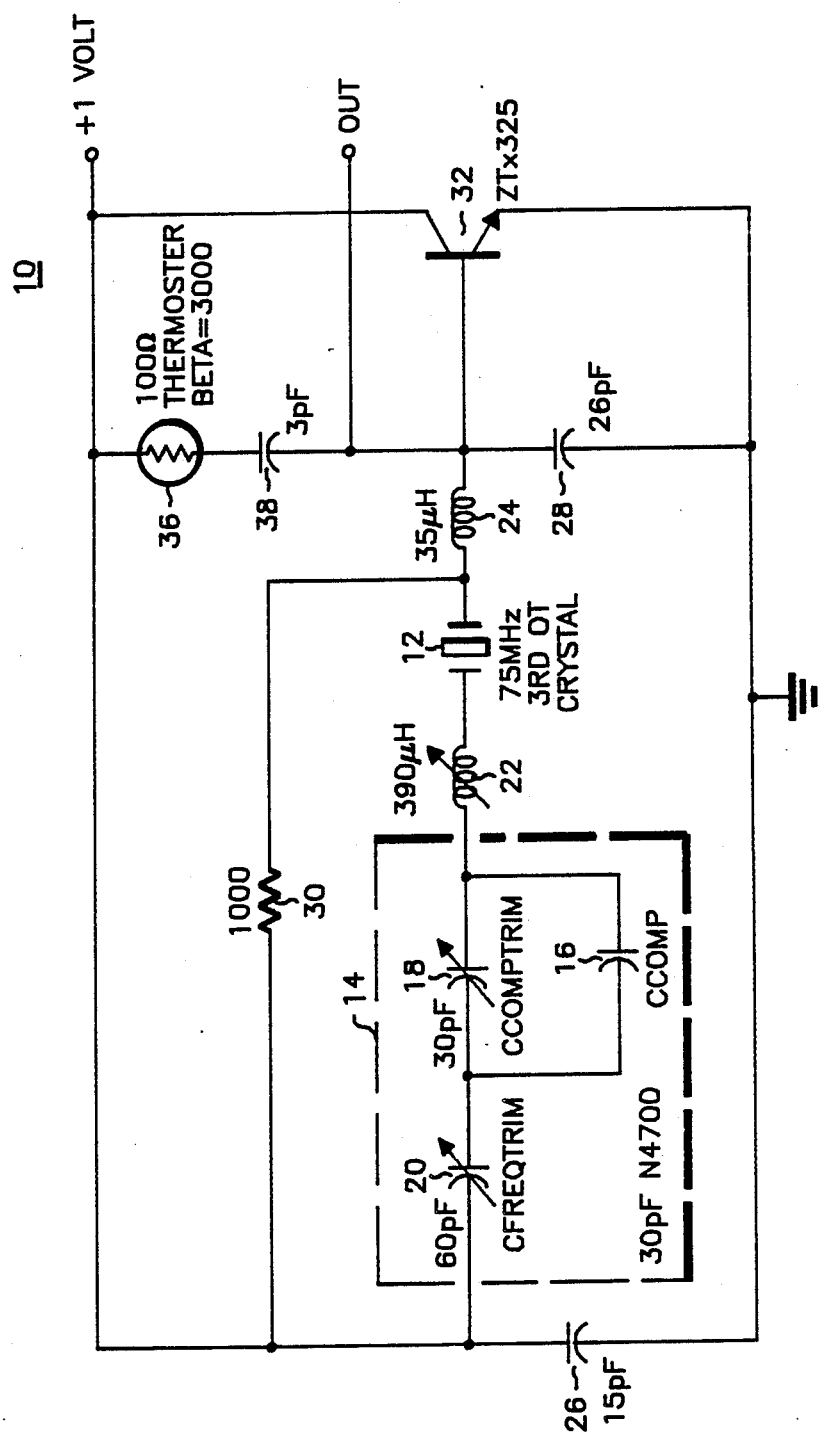
FIG. 1 is an exemplary oscillator circuit whose temperature compensation elements can be adjusted using the present method.

With respect to the figures, FIG. 1 illustrates an exemplary crystal oscillator 10 with which the present method of selecting passive temperature compensation component values can be used. The oscillator 10 is a modified version of a Colpitts oscillator which is well known in the art. The oscillator 10 includes an AT cut crystal 12 which is electrically connected in series with a passive compensation network 14.

In the known art, the network 14 has conventionally only included one capacitor or two parallel coupled capacitors. The values of said one or two capacitors were changed by an iterative, substitution, process to achieve the desired temperature compensation of the output frequency over a specified range.

The network 14 as used in the present method for temperature compensation includes a fixed temperature compensation capacitor, CCOMP, 16 which is coupled in parallel with a trimmable thick or thin film temperature compensation capacitor 18 CCOMPTRIM. The capacitor 16 is a conventional N-type, class 1, capacitor with a known temperature coefficient.

The capacitor 18 is a trimmable capacitor, with a neutral no temperature coefficient over the selected temperature range. This capacitor 18 is an NPO rated capacitor. Where capacitor 18 is an NPO capacitor, the temperature variation of the parallel combination of the capacitors 16, 18 can be determined by:

$$TC = \frac{C_{16}*(TC \text{ of } C_{16})}{C_{16} + C_{18}}$$

A third capacitor CFREQTRIM, 20 is coupled in series with the parallel connected capacitors 16, 18. The purpose of the capacitor 20 is to replace in the network 14 any capacitance lost in the process of trimming capacitor 18. As is discussed subsequently, the value of the CFREQTRIM capacitor 20 is determined such that the room temperature loop reactance of the resonant loop in which the crystal 12 is connected remains unchanged.

The capacitors 18 and 20 can be thick or thin film capacitors. The capacitors 18 and 20 must be adjustable by conventional capacitor trimming methods. A laser based trimming system is preferred.

The oscillator 10 additionally includes an adjustable trimming inductor 22 coupled between the crystal 12 and the temperature compensation network 14. A second inductor 24 is coupled in series with the crystal 12. Two fixed capacitors 26 and 28 are coupled to ground and to respective ends of a branch containing the compensation network 14, the inductor 22, the crystal 12 and the fixed inductor 24. A resistor 30 couples the crystal 12 to the one volt source. A transistor 32 is coupled between the source and ground with a base lead connected to a terminal of the fixed inductor 24.

Two prior art temperature compensation elements, a thermistor 36 and a series coupled capacitor 38 form a branch coupled between the one volt source and the base of the transistor 32. The elements 36 and 38 provide, in a known fashion, temperature compensation at the low temperature, minus ten degrees centigrade end point, of the temperature range.

It will be understood by those of skill in the art that while the present method is being disclosed in connection with the exemplary oscillator 10, the structure of the oscillator 10 is not a limitation of the present method. The present method can be used with a wide variety of oscillator circuits. The detailed circuit structure and component values are not important to the overall operation of the method.

The present method provides a way in which the capacitors 18 and 20 can be laser trimmed to provide the desired degree of temperature compensation, about one to three parts per million frequency variation, over a minus ten to plus fifty degree centigrade temperature range. Over this temperature range, as noted previously, it is known that AT cut crystals have an essentially linear frequency variation with temperature. This linear frequency versus temperature variation has a negative slope.

As is known from the prior art, the degree of temperature compensation can be enhanced by including a fixed end point compensation. In FIG. 1 the thermistor 36 and capacitor 38 provide such a function at the minus ten degree end point.

The present method takes advantage of the fact that over this temperature range the variation in crystal frequency is essentially linear with the negative slope. The outputs to the capacitor trimming system are not capacitance values but are oscillator output frequencies.

A laser trimming system can be used to trim the capacitor 18 and the capacitor 20 to a predetermined oscillation frequency for each while the oscillator has power applied thereto. Thus, the present method has the advantage that the compensation component adjustment process takes place while the oscillator is operating at some preselected ambient temperature. A further advantage of the present method is that a readily measurable parameter, the output frequency of the oscillator, is the only parameter of the circuit that must be measured while making the final adjustment to the capacitor values.

Figure 2:
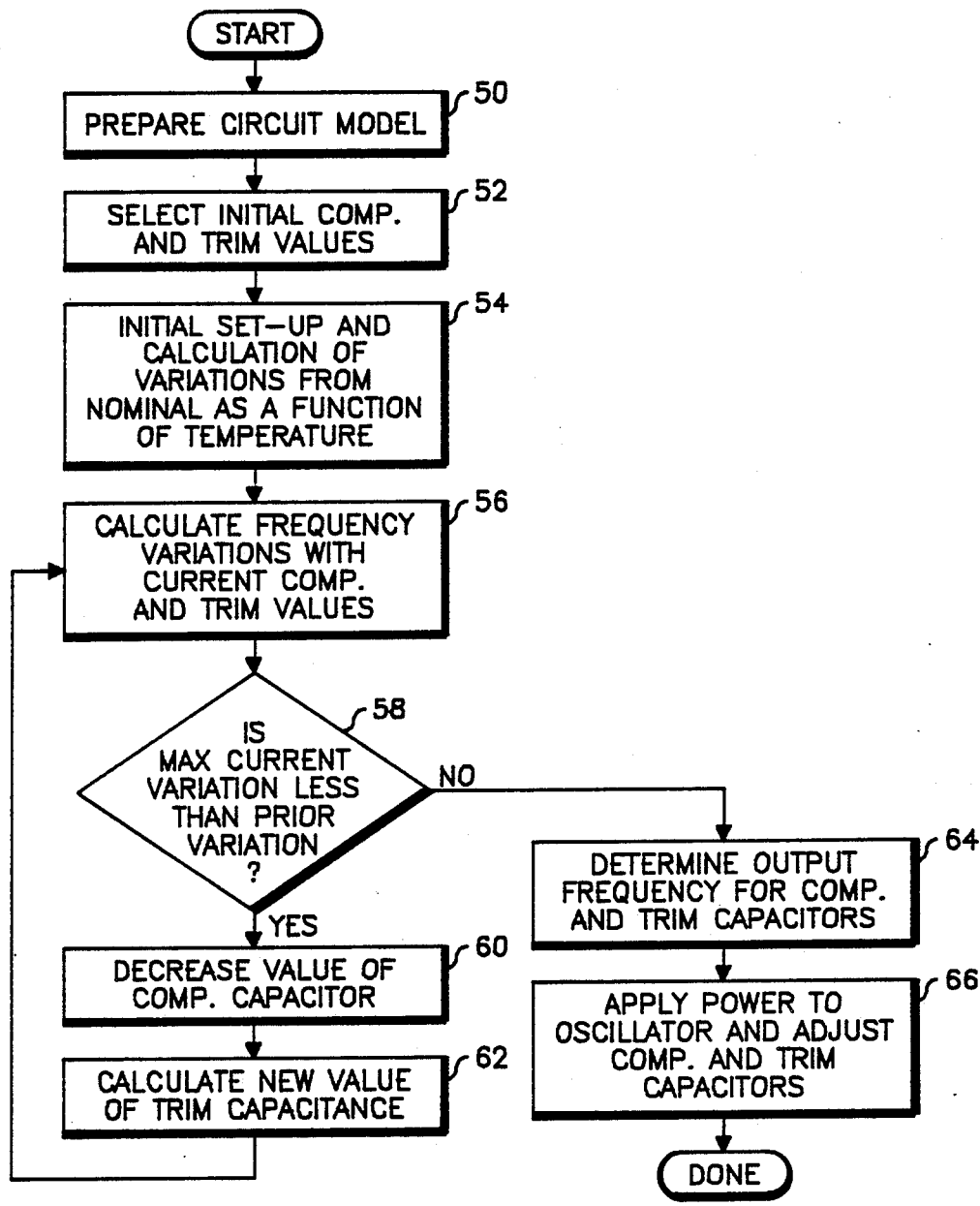
FIG. 2 is a summary flow diagram of the present method.

FIG. 2 is a summary flow diagram of the steps of the present inventive method, which presumes capacitor 18 will be trimmed first. In an initial step 50 a model of the oscillator 10 is prepared using conventional loop or node analysis techniques. An initial set of compensation values is selected in a step 52. Next a calculation is made as a function of temperature of nominal uncompensated circuit performance in a step 54. In a step 56 the total compensated circuit performance is determined over the temperature range.

In a step 58 the error magnitude or absolute value of the current maximum frequency variation from a nominal output frequency is compared with the previous maximum variation. If the current variation is less than the prior maximum variation, the value of the compensation capacitor 18 is decreased a selected amount in a step 60. In a step 62 a new value for the trim capacitor 20 is calculated. The process is then repeated.

In the event that the error magnitude does not decrease in the step 58, in a step 64 output frequencies are calculated to which the compensation and trim capacitors are to be trimmed. The compensation and trim capacitors can then be trimmed, either on-line or off-line, in a step 66.

The method of FIG. 2 minimizes error the magnitude of the maximum temperature related frequency variation from a nominal output frequency. Other error minimization criteria could be used. The present criteria however has the advantage of achieving an overall minimization of temperature induced errors for the total circuit.

Figure 3A:
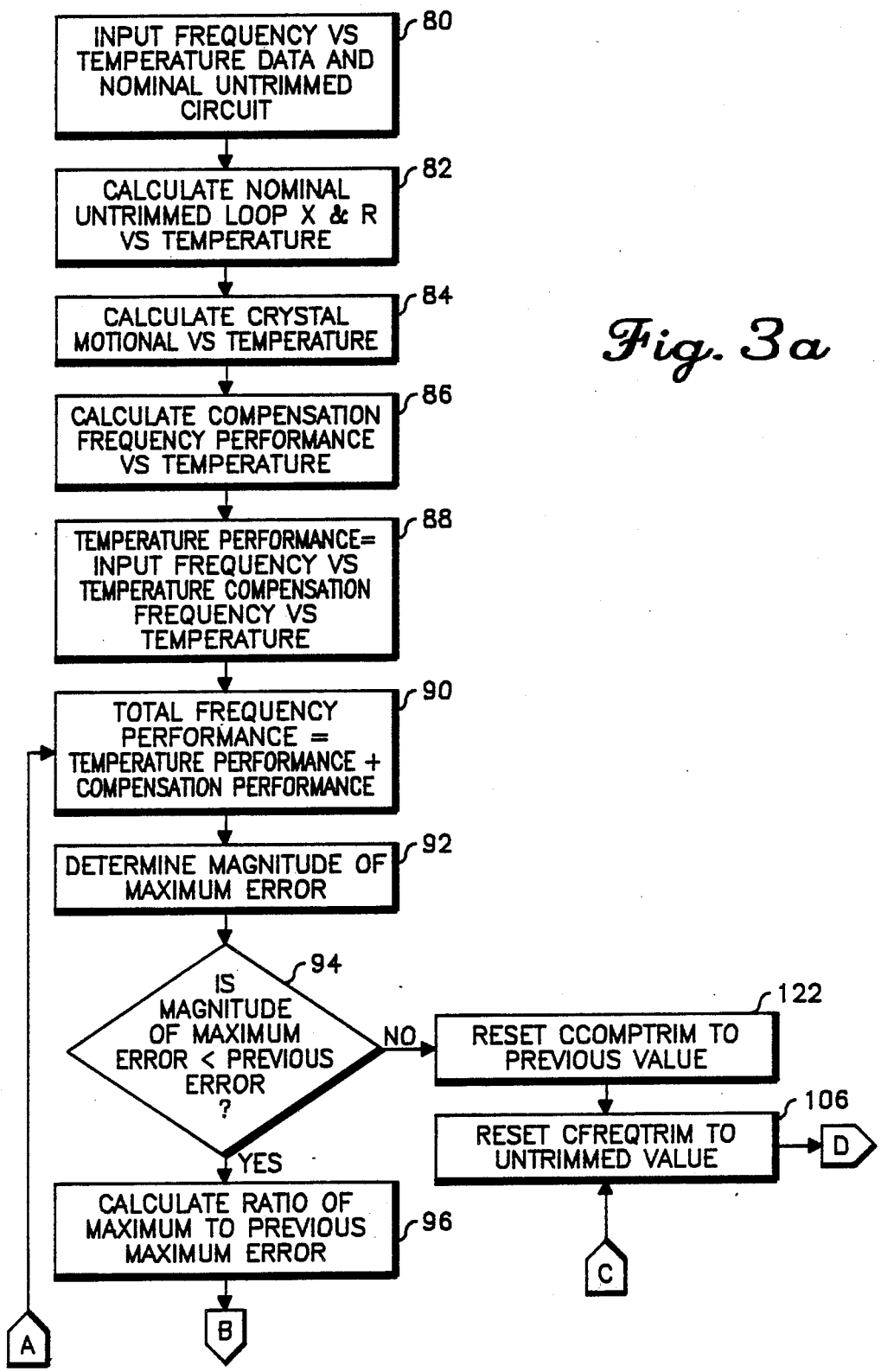
FIG. 3 is a detailed flow diagram of the present method.
Figure 3B:
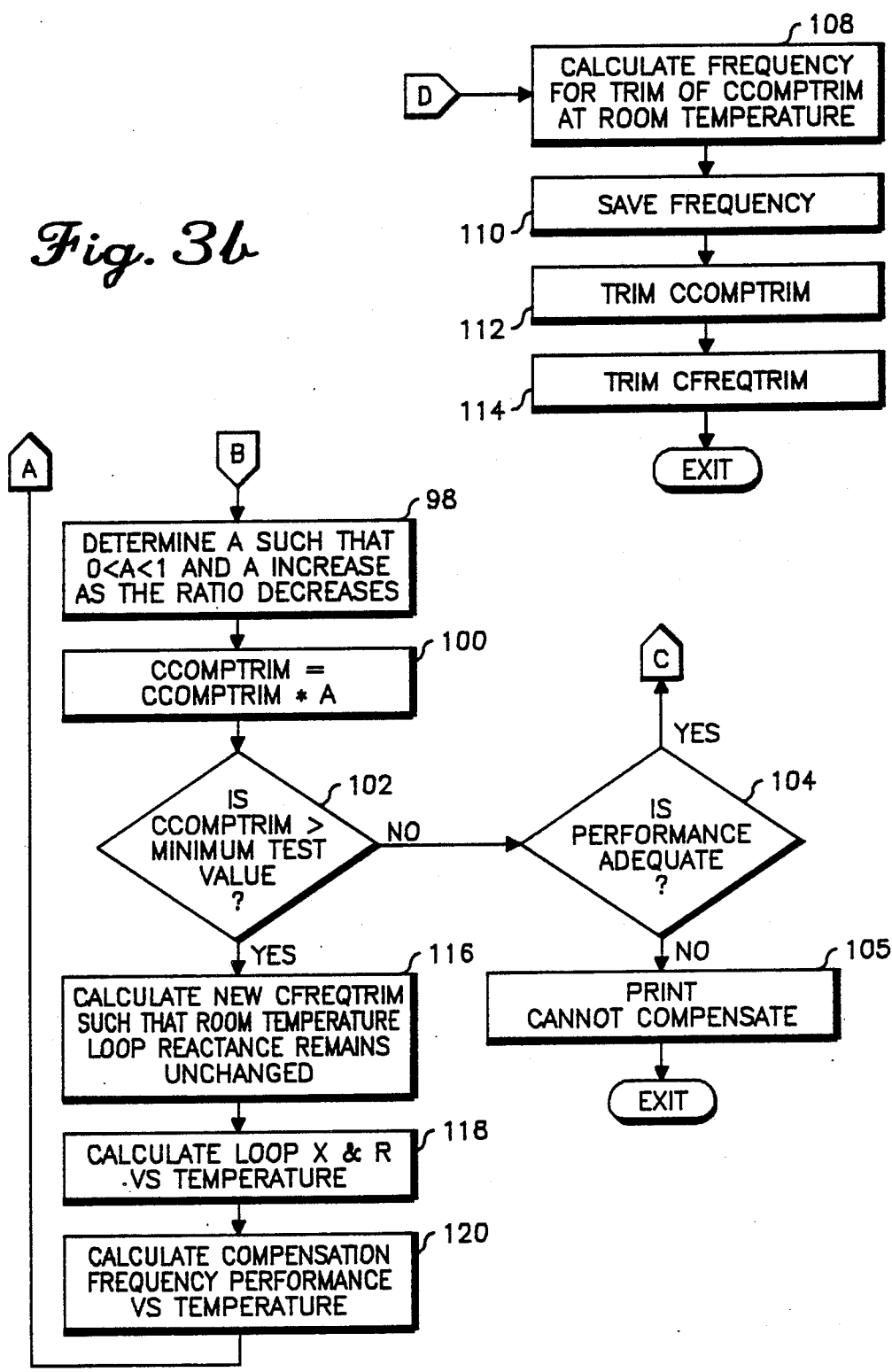

FIG. 3 illustrates in more detail the steps of the inventive method of FIG. 2. Subsequently a detailed computer program will be discussed which can carry out many of the steps of the method of FIG. 3 for the exemplary oscillator 10. In an initial step 80 a set of data indicating frequency variation versus temperature information is provided. Table 1, illustrates an exemplary set of this information.

TABLE 1

| FREQUENCY VARIATION V. TEMPERATURE | |
|---|---|
| Temperature in Degrees C. | Frequency Variation from Nominal in Parts Per Million |
| −10 | 5.83 |
| 0 | 4.33 |
| 10 | 2.73 |
| 20 | .92 |
| 30 | −.87 |
| 40 | −2.24 |
| 50 | −2.64 |

The left-most column of Table 1 identifies various points over the specified temperature range. The right-most column specifies variations in parts per million from a nominal 75 MHz oscillation frequency of the AT cut crystal 12 of FIG. 1. The input information of Table 1 must be premeasured. If plotted, the frequency variation versus temperature information of Table 1 represents, an essentially linear variation over the temperature range with a negative slope.

In addition, in the step 80, a nominal circuit model is provided, based for example, on a node analysis. In connection with this model, initial nominal values are provided, also as illustrated in FIG. 1, for the network 14. Note from FIG. 1 that the fixed compensation capacitor 16 is specified as a standard N-type capacitor with a known temperature coefficient. The trimmable capacitors 18 and 20 are specified as NPO-type capacitors with neutral temperature coefficients.

In a second step 82 a calculation is made of the nominal, untrimmed, loop reactance and resistance, for the loop excluding the crystal 12 but including the compensation network 14 as a function of temperature. In a step 84, a calculation is made of the motional capacitance of the crystal 12 as a function of temperature. This is a conventional calculation and a set of formulae therefore can be found in: "Investigation Into Temperature Variation Of Equivalent Circuit Parameters Of AT-Cut Quartz Crystal Resonators," by R. J. Holbeche and P. E. Morley, IEE Proceedings (British), Vol. 128, Part A, No. 7, October 1981, pg. 507–510.

In a step 86 the frequency variation of the oscillator 10, as a function of temperature is calculated over the specified temperature range including the temperature variations from the crystal model of steps 80 and 84. In a step 88 which is only executed during the initial pass through the method, the uncompensated, nominal, calculated performance of the circuit model is subtracted from the uncompensated measured performance of the circuit as input in step 80.

In a step 90, total frequency performance as a function of temperature is calculated. In a step 92 the error magnitude of the greatest frequency variation over the temperature range is determined.

Once the greatest error magnitude has been determined, in a step 94, the current error magnitude is compared to the previous error magnitude. If the current error magnitude is less than the previous error magnitude, the method continues its iteration process. In a step 96 a ratio is formed of the current error magnitude to the previous error magnitude. This ratio is used to form a weighting factor. This weighting factor is then used to adjust the size of the change to be made to the value of compensation capacitor 18.

In a step 98 a constant less than one is formed. The constant is then multiplied in a step 100 by the capacitance value of the capacitor 18 to form a new and smaller value of capacitance.

The new capacitance value is compared to a minimum test, lower threshold value, such as one-half pf, in a step 102. If the new compensation trim capacitance value is too small, the magnitude of the error is checked in a step 104. If the error magnitude is too large, the process terminates in a step 105 with a failure message.

In the event that performance of the circuit in the step 104 is adequate, the value of the frequency trim capacitor 20 is reset to its initial value in a step 106. The oscillation frequency for the oscillator with the capacitor 20 untrimmed and the capacitor 18 trimmed is then determined at room temperature in a step 108.

Both the frequency of oscillation from the step 108 and the frequency of oscillation with both capacitors 18 and 20 trimmed from the step 90 are saved for later use in a step 110.

The capacitor 18 can then be trimmed on line or off line in a step 112 followed by trimming the capacitor 20 in a step 114. The method is then complete.

The trimming process takes place while the circuit 10 has power applied thereto. The trimming of the capacitor 18 continues until oscillator 10 oscillates at the frequency determined in the step 108. The capacitor 20 is then trimmed until the frequency of oscillation of the oscillator 10 equals the value determined in the step 90.

As an alternate, the frequency trim capacitor 20 could be trimmed first and then the compensation capacitor 18 could be trimmed. To trim the frequency compensation capacitor first, in step 106 the CCOMP-TRIM capacitor 18 would be reset to its untrimmed, nominal value and then in step 108 the trim frequency would be calculated for the frequency trim capacitor 20.

With respect to the step 102, if the new value of the capacitor 18 exceeds the minimum test, lower threshold value, a new value for the frequency trim capacitor is calculated in a step 116. In a step 118 the reactance and resistance are calculated, as in step 82. The compensated frequency performance is then determined in a step 120, corresponding to the step 86. The method then iterates commencing with the step 90.

With respect to the step 94, if the current magnitude error is not less than the previous error magnitude, the previously calculated value of capacitance for the capacitor 18 is restored in a step 122 and the method is exited via the previously discussed step 106.

Table 2, following, illustrates an exemplary computer program, written in BASIC, that can be used for carrying out the steps 82-122, exclusive of the steps 112, 114 for the oscillator 10 of FIG. 1.

TABLE 2

```
10      !CIRCUIT OPERATES 45PPM BELOW SERIES
20      DIM P(20),R(20),X(20),Osc(20),Freq(20),Freqtotal(20)
30      Freqlimit=2
40      Pass=1
50      Test1=100
60      Freq(0)=0
70      Freq(1)=5.83
80      Freq(2)=4.33
90      Freq(3)=2.73
100     Freq(4)=.92
110     Freq(5)=-.87
120     Freq(6)=-2.24
130     Freq(7)=-2.64
140     GOTO 190
150     ! COMPLEX INVERT
160     Rc=Ra/(Ra^2+Ia^2)
170     Ic=-Ia/(Ra^2+Ia^2)
180     RETURN
190     P3=3.0E-11
200     P12=6.0E-11
210     P2=3.0E-11
220     FOR T=-20 TO 50 STEP 10
230     IF T=-20 THEN T=25
240     Q1=40                            !FREQ ADJ COIL Q
250     Q7=40                            !SERIES COIL Q
260     T08=25                           !THERM REF TEMP
270     B8=3000                          !THERM BETA
280     P(1)=3.9E-7*(1+(T-25)*.0002)     !FREQ ADJ COIL
290     Tc=.1444940476-.006107142857*T+1.309523809E-5*T^2
300     P(2)=P2*(1+Tc)                   !COMP CAP
310     P(3)=P3                          !COMP CAP TRIM
320     P(4)=1000                        !DEQING RESISTOR & BIAS
330     P(5)=1.5E-11                     !FEEDBACK CAP
340     P(6)=2.6E-11                     !BASE EMITTER FEEDBACK
350     P(7)=3.5E-7*(1+(T-25)*.0002)     !SERIES COIL
360     P(8)=100*EXP(B8*(1/(T+273)-1/(T08+273)))  !THERM
370     P(9)=3.0E-12                     !COLD CAP
```

```
380     P(10)=155*(1-(T-25)*.004129)  !XTOR INPUT R
390     P(11)=6.135E-12*(1+(T-25)*.0012134)  !XTOR INP
UT C
400     P(12)=P12                    !COMP SERIES CAP
410     W=2*PI*7.5E+7
420     Ia=-1/W/P(11)
430     Ra=P(10)
440     GOSUB 150
450     Ra=Rc
460     Ia=Ic+W*P(6)
470     GOSUB 150
480     Ra=Rc
490     Ia=Ic-1/W/P(5)
500     GOSUB 150
510     Ra1=Rc
520     Ia1=Ic
530     Ra=P(8)
540     Ia=-1/W/P(9)
550     GOSUB 150
560     Ra=Rc+Ra1
570     Ia=Ic+Ia1
580     GOSUB 150
590     Ra=Rc+W*P(7)/Q7
600     Ia=Ic+W*P(7)
610     GOSUB 150
620     Ra=Rc+1/P(4)
630     Ia=Ic
640     GOSUB 150
650     Ti=(T+20)/10
660     IF T=25 THEN Ti=0
670     R(Ti)=Rc+W*P(1)/Q1
680     X(Ti)=Ic+W*P(1)-1/W/P(2)/W/P(3)/(1/W/P(2)+1/W/
P(3))
690     X(Ti)=X(Ti)-1/W/P(12)
700     IF T=25 THEN T=-20
710     IF Pass=1 THEN X0=X(0)
720     NEXT T
730     IF Pass=3 THEN GOTO 1200
740     PRINT
750     PRINT "TEMP   LOOP X   TOTAL PERFORMANCE"
760     FOR T=-20 TO 50 STEP 10
770     I=(T+20)/10
780     IF T=-20 THEN T=25
790     Cm=1.971E-15*(1+(T-25)*.00024)
800     C0=4.5E-12
810     Df=-X(I)/(2/Cm/W-2*C0*X(I)/Cm)*1.E+6
820     IF Pass=1 THEN F=Freq(I)-Df-45
830     IF Pass=1 THEN Freqtotal(I)=F
840     IF Pass=2 THEN F=Freqtotal(I)
850     Df=F+Df+45
860     IF T=25 THEN Ref=Df
870     IF Pass=1 THEN Freq(I)=Df
880     IF T=25 THEN 910
890     Osc(I)=Df-Ref
900     PRINT USING "DDDDD,DDDDDD.DD,DDDDDD.DD";T,X(I)
,Df-Ref
```

```
910   IF T=25 THEN T=-20
920   NEXT T
930   Df=-X(0)/(2/Cm/W-2*C0*X(0)/Cm)*1.E+6
940   Test=0
950   FOR I=1 TO 7
960   IF ABS(Osc(I))>Test THEN Test=ABS(Osc(I))
970   NEXT I
980   IF Test>Test1 THEN
990   IF Test>Freqlimit THEN PRINT "CANNOT COMPENSAT
E"
1000  IF Test>Freqlimit THEN GOTO 1310
1010  Pass=3
1020  GOTO 1140
1030  ELSE
1040  A=(Test/Test1)^.5-.01
1050  IF Test>2.5 THEN A=A*2.5/Test
1060  Test1=Test
1070  IF Pass=1 THEN A=.95
1080  END IF
1090  Pass=2
1100  P3=A*P3
1110  IF P3<5.E-13 THEN GOTO 1260
1120  P12=(P2+P3)*2.0E-11/(P2+P3-2.0E-11)
1130  GOTO 220
1140  P3=P3/A
1150  P12=(P2+P3)*2.0E-11/(P2+P3-2.0E-11)
1160  PRINT "PAPA CAP = ";P3;"    SERIES CAP = ";P12
1170  Df1=-X(0)/(2/Cm/W-2*C0*X(0)/Cm)*1.E+6
1180  P12=6.0E-11
1190  GOTO 220
1200  Df2=-X(0)/(2/Cm/W-2*C0*X(0)/Cm)*1.E+6
1210  Df0=-X0/(2/Cm/W-2*C0*X0/Cm)*1.E+6
1220  PRINT "INITIAL FREQ = ";Df0;"PPM"
1230  PRINT "COMP TRIM FREQ = ";Df2;"PPM"
1240  PRINT "FREQ TRIM FREQ = ";Df1;"PPM"
1250  GOTO 1310
1260  IF Test<Freqlimit THEN
1270  GOTO 1140
1280  ELSE
1290  PRINT "CANNOT COMPENSATE"
1300  END IF
1310  END
```

The program line numbers 60–130 of Table 2 correspond to the set of data indicating frequency variation versus temperature information of Table 1 input in the step 80 of FIG. 3. The program line numbers 190–400 of Table 2 correspond to the model of the oscillator circuit 10 of FIG. 1 input in the step 80. The line numbers 190–720 of Table 2 correspond to the nominal, untrimmed reactance and resistance calculation of the step 82 of FIG. 3. As will be understood by those of skill in the art, the program lines 60–720 from Table 2 correspond to the steps 80 and 82. The calculation in the step 82 carried out by the program of Table 2 also includes estimated nominal temperature coefficients for the frequency adjusting coil 22, the temperature compensation capacitor 16, the fixed coil 24 and the input circuit to the transistor 32.

The program line numbers 790 and 800 of Table 2 correspond to the crystal modeling step 84 of FIG. 3. The line number 820 of Table 2 corresponds to the step 86 of FIG. 3. The lines numbered 940–970 of Table 2 correspond to the maximum frequency variation error magnitude determination of step 92 of FIG. 3.

The lines numbered 980–1010 of Table 2 correspond to the comparison of the current maximum frequency variation, or error, from nominal to the previous maximum frequency variation from nominal of the step 94 of FIG. 3. The lines numbered 1040–1070 of Table 2 correspond to the determination of the weighting factor of the steps 96 and 98 of FIGS. 3. The line numbered 1100 of Table 1 corresponds to the step 100 of FIG. 3.

The line numbered 1110 of Table 2 corresponds to the comparison of the value of the CCOMPTRIM capacitor to the minimum test lower threshold value of the step 102 of FIG. 3. The line numbered 1120 of Table 2 corresponds to the calculation of the new value of the CFREQTRIM capacitor of the step 116 of FIG. 3. The line numbered 1130 of the Table 2 corresponds to the steps 118 and 120 of FIG. 3.

The line number 1140 of Table 2 corresponds to the step 122 of FIG. 3. The line number 1180 of Table 2 corresponds to the step 106 of FIG. 3. The lines numbered 1190–1200 correspond to the calculation of the frequency at room temperature to which the CCOMPTRIM capacitor is to be trimmed at room temperature as in the step 108 of FIG. 3.

The lines numbered 1230–1240 of Table 2 print the two output frequencies that correspond to the step 110 of FIG. 3. The lines 1260 and 1270 of Table 2 correspond to the circuit performance evaluation of the step 104 of FIG. 3. The line 1290 from Table 2 corresponds to the failure message exit and at the step 105 of FIG. 3.

It will be understood that the exemplary program of Table 2 is merely one possible implementation of some of the method steps from FIG. 3. The program of Table 2 should not be regarded as a limitation of the steps of the method of FIG. 3.

Table 3 illustrates the results of using the method of FIG. 3, as implemented in part by the program of Table 2, to determine compensation component values for the oscillator 10. The nominal component values of FIG. 1 in the oscillator 10 have been used as input data in the step 80 of FIG. 3. Table 3 illustrates 10 iterations executed by the program of Table 2 with respect to the oscillator 10 of FIG. 1.

TABLE 3

| TEMP | LOOP X | TOTAL | PERFORMANCE | |
|---|---|---|---|---|
| −10 | 110.63 | 5.85 | | |
| 0 | 113.88 | 4.33 | | |
| 10 | 115.31 | 2.73 | | |
| 20 | 115.98 | .92 | | Input Information |
| 30 | 116.06 | −.87 | | |
| 40 | 116.07 | −2.24 | | |
| 50 | 116.09 | −2.64 | | |
| TEMP | LOOP X | TOTAL | PERFORMANCE | |
| −10 | 75.43 | 4.77 | | |
| 0 | 78.63 | 3.80 | | |
| 10 | 80.01 | 2.49 | | |
| 20 | 80.53 | .85 | | Iteration No. 1 |
| 30 | 80.67 | −.81 | | |
| 40 | 80.63 | −2.08 | | |
| 50 | 80.51 | −2.39 | | |
| TEMP | LOOP X | TOTAL | PERFORMANCE | |
| −10 | 78.07 | 3.03 | | |
| 0 | 80.57 | 2.50 | | |
| 10 | 81.21 | 1.68 | | |
| 20 | 80.94 | .58 | | Iteration No. 2 |
| 30 | 80.25 | −.53 | | |
| 40 | 79.33 | −1.21 | | |
| 50 | 78.30 | −.90 | | |
| TEMP | LOOP X | TOTAL | PERFORMANCE | |
| −10 | 79.53 | 2.06 | | |
| 0 | 81.65 | 1.77 | | |
| 10 | 81.88 | 1.23 | | |
| 20 | 81.18 | .42 | | Iteration No. 3 |
| 30 | 80.01 | −.37 | | |
| 40 | 78.59 | −.70 | | |
| 50 | 77.01 | −.04 | | |
| TEMP | LOOP X | TOTAL | PERFORMANCE | |
| −10 | 83.16 | 1.64 | | |
| 0 | 82.12 | 1.46 | | |
| 10 | 82.17 | 1.03 | | |
| 20 | 81.28 | .35 | | Iteration No. 4 |
| 30 | 79.90 | −.27 | | |
| 40 | 78.23 | −.48 | | |
| 50 | 76.44 | −.34 | | |

| TEMP | LOOP X | TOTAL PERFORMANCE | |
|---|---|---|---|
| -10 | 80.50 | 1.41 | |
| 0 | 82.38 | 1.28 | |
| 10 | 82.34 | .92 | |
| 20 | 81.33 | .31 | Iteration No. 5 |
| 30 | 79.84 | -.25 | |
| 40 | 78.07 | -.36 | |
| 50 | 76.12 | .56 | |
| TEMP | LOOP X | TOTAL PERFORMANCE | |
| -10 | 80.74 | 1.25 | |
| 0 | 82.55 | 1.16 | |
| 10 | 82.45 | .84 | |
| 20 | 81.37 | .29 | Iteration No. 6 |
| 30 | 79.80 | -.23 | |
| 40 | 77.94 | -.28 | |
| 50 | 75.98 | .70 | |
| TEMP | LOOP X | TOTAL PERFORMANCE | |
| -10 | 80.92 | 1.13 | |
| 0 | 82.69 | 1.07 | |
| 10 | 82.53 | .79 | |
| 20 | 81.49 | .27 | Iteration No. 7 |
| 30 | 79.77 | -.21 | |
| 40 | 77.85 | -.21 | |
| 50 | 75.73 | .81 | |
| TEMP | LOOP X | TOTAL PERFORMANCE | |
| -10 | 81.07 | 1.03 | |
| 0 | 82.80 | 1.00 | |
| 10 | 82.60 | .74 | |
| 20 | 81.43 | .25 | Iteration No. 8 |
| 30 | 79.75 | -.19 | |
| 40 | 77.77 | -.16 | |
| 50 | 75.59 | .91 | |
| TEMP | LOOP X | TOTAL PERFORMANCE | |
| -10 | 81.28 | .94 | |
| 0 | 82.90 | .93 | |
| 10 | 82.64 | .70 | |
| 20 | 81.45 | .24 | Iteration No. 9 |
| 30 | 79.72 | -.17 | |
| 40 | 77.70 | -.11 | |
| 50 | 75.46 | .99 | |
| TEMP | LOOP X | TOTAL PERFORMANCE | |
| -10 | 81.28 | .89 | |
| 0 | 82.96 | .89 | |
| 10 | 82.70 | .67 | Last Iteration |
| 20 | 81.46 | .23 | |
| 30 | 79.71 | -.17 | |
| 40 | 77.65 | -.08 | |
| 50 | 75.39 | 1.04 | |

PAPA CAP = 4.7513002500E-12   SERIES CAP = 4.71162537011E-11
INITIAL FREQ = -71.8741321058 PPM
COMP TRIM FREQ = -52.1812773019 PPM
FREQ TRIM FREQ = -45.4401940987 PPM

The left-most column labeled TEMP, of each iteration illustrated in Table 3 lists the temperature points over the specified range at which the calculation were carried out by the program of Table 2. The right-most column, labeled TOTAL PERFORMANCE, of each iteration specifies the resultant frequency variation from nominal, expressed in parts per million over the temperature range. The center column of each iteration lists the loop reactance as a function of temperature as calculated in the step 118 of FIG. 3.

In the Input Information printout at the start of Table 3, the TOTAL PERFORMANCE column includes the frequency variation information as a function of temperature provided in the step 80 from Table 1. Iterations 1-9 from Table 3 illustrate the improvement in the TOTAL PERFORMANCE column as the values of the CCOMPTRIM capacitor 18 and the CFREQTRIM capacitor 20 are adjusted. As can be seen from Table 3, the maximum frequency variation or error magnitude decreases with each iteration.

In the Last Iteration printout shown in Table 3, the frequency variation maximum or error magnitude exceeded the frequency variation maximum error or magnitude of the previous or ninth iteration. Hence, as required in the step 94 of FIG. 3, the method terminated with the compensation component values and frequencies determined in the ninth iteration.

The reduced value of the CCOMPTRIM capacitor 18, as listed at the bottom of the last iteration from Table 3 as PAPA CAP, was determined by the method to be 4.75 pf. The reduced value of the CFREQTRIM capacitor 20 as listed at the bottom of the last iteration from Table 3 as SERIES CAP, was 47.11 pf. The respective nominal initial values of the capacitors 18 and 20 were 30 pf and 60 pf respectively.

Of more importance to the completion of the method are the two target frequencies specified at the end of the Last Iteration from Table 3. The COMP TRIM FREQ specifies the frequency, expressed in parts per million from the series frequency of 45 PPM above 75 MHz, to which the CCOMPTRIM capacitor 18 is to be adjusted in the trimming step 112. The FREQ TRIM FREQ specifies the frequency, expressed in parts per million from the above-noted series frequency, to which the CFEQTRIM capacitor 20 is to be adjusted in the trimming step 114.

The two target output frequencies can then be used to control an on-line or an off-line laser based trimming system. Thus a readily, measurable electrical parameter can be used to control the adjustment of the values of the passive compensation components 18 and 20.

While the present method has been described in connection with a specific circuit, it will be understood that the present method is applicable to a broad variety of oscillators that incorporate AT cut crystals. The broader aspects of the invention include the use of either hardwired logic or programmed control units to carry out various steps of the method. The broader aspects of the invention also include the use of systems to trim the compensation capacitors using other than laser based trimming systems.

The broader aspects of the invention also include using the present method to compensate other types of crystals. For example, and without limitation, the method could also be used in connection with the compensation of GT cut crystals.

What is claimed is:

1. A method of optimizing the output frequency versus temperature performance of a circuit over a specified range individually tailored to said circuit while simplifying the adjustment to at least two designated components therein for effecting temperature compensation thereof, the method comprising the steps of:
    (a) correlating a previously determined model performance of the circuit with the measured performance thereof while utilizing initial values for said designated components therein for establishing a first previous performance;
    (b) fractionally modifying the values of said designated components to predict a new performance of the circuit without measuring said circuit;
    (c) comparing said new performance with a previous performance and, if there is an improvement, updating said previous performance before repeating step (b) above; and
    (d) utilizing the present values of said designated components to calculate two target output frequencies for adjusting each designated component in a predetermined order while remaining at a single ambient temperature, thereby simplifying the adjustment process to achieve optimization of the output frequency versus temperature performance of said circuit.

2. The method as defined in claim 1 wherein the step of correlating comprises substracting the measured performance of said circuit from the model performance thereof.

3. The method as defined in claim 1 wherein the step of fractionally modifying the values of said designated components includes adjusting trimmable reactive components such that a variable temperature coefficient is effected while maintaining an essentially constant reactance therethrough.

4. The method as defined in claim 1 wherein the fixed temperature of step (d) includes a given ambient temperature.

5. The method as defined in claim 1 wherein said circuit is a crystal controlled oscillator and said components are capacitors.

6. The method as defined in claim 1 wherein the step of fractionally modifying the values of said designated components comprises reducing the value of first and second designated components therein.

7. The method as defined in claim 1 wherein the step of utilizing the present value of the first designated component to calculate a first target output frequency for adjusting said component comprises reducing the value of a temperature compensation capacitor until the output frequency of said oscillator equals said first target output frequency.

8. The method as defined in claim 1 wherein the step of utilizing the present value of the second designated component to calculate a second target output frequency for adjusting said component comprises reducing the value of a frequency trim capacitor until the output frequency of said oscillator equals said second target output frequency.

9. The method as defined in claim 7 or 8 wherein the steps of reducing the value include directing a laser beam at a designated capacitor and removing portions thereof with said laser beam.

10. A method of determining component values for temperature compensating a crystal oscillator having an adjustable temperature compensation capacitor and an adjustable frequency trim capacitor, the method comprising the steps of:

(a) determining the output frequency versus temperature performance of said oscillator over a specified temperature range utilizing previously inputted initial values for said temperature compensation and said frequency trim capacitors therein;

(b) determining the maximum variation in the output frequency of said oscillator from a predetermined nominal frequency over said temperature range;

(c) comparing the present maximum frequency variation to a previous maximum variation and proceeding to step (f) if the present maximum variation exceeds said previous maximum variation;

(d) if the present maximum variation is less than the previous maximum variation, then reducing the value of the temperature compensation capacitor by a predetermined amount;

(e) determining a new value for the frequency trim capacitor in order that an associated loop reactance at a fixed ambient temperature remains essentially unchanged, before returning to step (b) above;

(f) determining a first target output frequency of said oscillator utilizing the present value of said temperature compensation capacitor and the initial value of said frequency trim capacitor;

(h) physically reducing the value of said temperature compensation capacitor, while activating said oscillator and measuring the output frequency thereof, until the measured oscillation frequency equals said first target output frequency; and (i) physically reducing the value of said frequency trim capacitor, while activating said oscillator and measuring the output frequency thereof, until the measured oscillation frquency equals said second target output frequency.

11. The method of temperature compensation as defined in claim 10, step (d) comprising the step of:

comparing the reduced value of said temperature compensation capacitor to a threshold having a predetermined value and if said reduced value is less than said threshold, then comparing the present maximum variation to a previous maximum variation, and if said present maximum variation exceeds said previous maximum variation, then generating a failure message.

12. The method of temperature compensation as defined in claim 10 wherein said steps of physically reducing the values of said temperature compensation and said frequency trim capacitors include directing a laser beam at each one of said capacitors to reduce said capacitor value by removing a portion thereof.

13. The method of temperature compensation as defined in claim 10 comprising step (d) of reducing the value of said compensation capacitor by a predetermined amount includes a fixed amount.

14. The method of temperature compensation as defined in claim 10 comprising in step (d) of reducing the value of said compensation capacitor by a predetermined amount includes a variable amount.

15. The method of temperature compensation as defined in claim 10 wherein said predetermined amount is a variable amount proportional to a ratio of the present maximum variation to the previous maximum variation.

16. The method of temperature compensation as defined in claim 10 comprises forming said first and second target output frequencies at said fixed temperature includes a given ambient temperature.

17. Apparatus for effecting a variable temperature coefficient while maintaining an essentially constant loop reactance therethrough, the apparatus comprising in combination:

parallel coupled reactance means, formed by first trimmable reactance means having a neutral temperature coefficient, and fixed reactance means having a negative temperature coefficient coupled in parallel thereto; and second trimmable reactance means having a neutral temperature coefficient and coupled in series with said parallel coupled reactance means, said first trimmable reactance means designated as a temperature compensation component for effecting a variable temperature coefficient in conjunction with said fixed reactance means having a negative temperature coefficient, and said second trimmable reactance means designated as a frequency trim component for effecting an essentially constant loop reactance by offseting the effects of changes previously made to said temperature compensation component, thereby providing apparatus capable of high speed adjustment for optimizing the temperature performance of a circuit utilizing the apparatus.

18. The apparatus according to claim 17, wherein said reactance means are capacitors.

19. The apparatus according to claim 17, wherein said first and second trimmable reactance means are variable capacitors.

20. The apparatus according to claim 19, wherein said variable capacitors are laser-trimmable capacitors, such as thick-film capacitors.

21. The apparatus according to claim 19, wherein said variable capacitors are laser-trimmable capacitors, having initial values of capacitance greater than needed.

* * * * *

UNITED STATES PATENT AND TRADEMARK OFFICE
CERTIFICATE OF CORRECTION

PATENT NO. : 4,658,223

DATED : April 14, 1987

INVENTOR(S) : Dennis F. Marvin and Roger Steele

It is certified that error appears in the above-identified patent and that said Letters Patent is hereby corrected as shown below:

Column 5, line 36: Change "error the" to -- the error --.

Column 8, line 9-10: Change "magnitude error" to read -- error magnitude --.

Column 14, line 3: Insert the word -- and -- between the words "message" and "exit".

Signed and Sealed this

Eleventh Day of August, 1987

Attest:

DONALD J. QUIGG

Attesting Officer

Commissioner of Patents and Trademarks